United States Patent [19]

Engel et al.

[11] Patent Number: 4,946,545
[45] Date of Patent: Aug. 7, 1990

[54] METHOD OF GROWING HOMOGENEOUS CRYSTALS

[75] Inventors: Günter Engel, Leitring; Alfred Enko, Graz; Peter W. Krempl, Graz/Ragnitz; Uwe Posch, Graz, all of Austria

[73] Assignee: AVL Gesellschaft für Verbrennungskraftmaschinen und Messtechnik M.B.H. Prof.Dr.Dr.h.c. Hans List, Graz, Austria

[21] Appl. No.: 238,580

[22] Filed: Aug. 31, 1988

[30] Foreign Application Priority Data

Sep. 4, 1987 [AT] Austria .................. 2242/87

[51] Int. Cl.$^5$ .................. C30B 7/10; C30B 29/14
[52] U.S. Cl. .................. 156/623 R; 156/DIG. 70; 156/DIG. 61; 156/DIG. 113; 423/311; 423/305
[58] Field of Search .................. 156/623 R, DIG. 70, 156/DIG. 61; 423/311, 305

[56] References Cited

U.S. PATENT DOCUMENTS 4,382,840  5/1983  Chai et al. .................. 156/623 R
4,481,069  11/1984  Chai et al. .................. 156/623 R

FOREIGN PATENT DOCUMENTS 3309598  6/1986  Fed. Rep. of Germany .
2559166  6/1986  France .

*Primary Examiner*—Gary P. Straub
*Assistant Examiner*—M. Franklin
*Attorney, Agent, or Firm*—Watson, Cole, Grindle & Watson

[57] ABSTRACT

In order to prevent crystal seeds with retrograde solubility from dissolving in the hydrothermal growing solution at the beginning of the growing process, and to protect the finished crystal at the end of the growing process, and in order to reach the thermodynamic growth equilibrium as soon as possible, the proposal is put forward that the growing solution be prepared, pre-saturated and pre-heated to a temperature close to saturation temperature outside of the growing tank, and that, for the growing process proper, the hot growing solution be added to the pre-heated growing tank provided with crystal seeds, where it should be further heated to a temperature at which the crystals start growing, and, further, that the hot growing solution be quickly removed from the growing tank as soon as the growing process has been completed.

12 Claims, 2 Drawing Sheets

METHOD OF GROWING HOMOGENEOUS CRYSTALS

BACKGROUND OF THE INVENTION

This invention relates to a method of growing homogeneous crystals from a hydrothermal growing solution provided in a growing tank, solubility of the crystals in the growing solution decreasing with an increase in temperature (retrograde solubility), and to a device for implementation of the method, comprising one or more growing tanks containing a hydrothermal growing solution, with fixtures holding the raw material for the crystals and the crystal seeds, which tank(s) can be connected to at least one further tank by means of a tube.

The term "homogeneous" in this context refers to crystals where both crystal and crystal seed have the same crystal structure and preferably consist of the same substance, or whose lattice constants are largely identical, at least.

DESCRIPTION OF THE PRIOR ART

When crystals, or rather, monocrystals with retrograde solubility are grown from hydrothermal growing solutions according to conventional methods, problems may occur both during start-up and shut-down of the autoclave due to the increasing solubility of the crystals with a decrease in temperature. This involves partial dissolving of the crystal seeds when the autoclave is taken into operation, and of the finished crystals when the autoclave is shut down and the cooling process is too slow.

Another disadvantage of conventional growth methods is that the growing tank is not available for the growing process proper during the preparation and pre-saturation stages of the growing solution—often a period of several weeks. The term preparation refers to the process by which the growing solution itself, i.e., the metal salt dissolved in an acid/water mixture, is obtained from a mixture of metal oxide, acid and water.

Conventional growth methods often necessitate compromises in the choice of material for the lining of the autoclave, which is subject to the most diverse thermodynamic and mechanical loads prevailing during the preparation stage and the growing process.

A method of the above kind and a device for implementation of this method are described in U.S. Pat. No. 4 382 840, where a growing tank in which the growing and saturation compartments are arranged horizontally, side by side, is connected to a further tank by means of a tube. This cylindrical tank, which is heatable, contains the acid required for the growing process, which—after having been heated—is pumped into the growing tank by means of a plunger guided in the tank and sealed towards the outside, and which is drained from the tank at the end of the growing process.

The disadvantage of this method is that most of the seeds are dissolved and thus destroyed by the hot acid which is pumped into the growing tank, and that the time required for setting the growth parameters is lost for the growing process itself.

Data on suitable compositions of growing solutions and suitable growing temperatures, for example for $ABO_4$ crystals, A coming from the group Fe, Al, Ga and B from the group P, As, are published in German Laid Open Print No. 3 309 598. A description of process steps or arrangements effectively preventing the crystal seeds in the growing solution from dissolving is not given in this print.

In this context it is a known technique to presaturate the growing solution before it is added to the growing tank, i.e., at temperatures in the range of the growing temperature. After having cooled down to room temperature the growing solution is filled into the growing tank. Since crystals with retrograde solubility have a higher solubility in growing solutions at room temperature than at growing temperature, however, this will again cause damage to the seeds and to the finished crystals when the growing solution is filled in and at the end of the growing process. Besides, the problem of pumping the growing solution, which usually is aggressive, has not been solved satisfactorily in the above patent description, as this process should be performed as quickly as possible in order to save the crystal seeds and the crystals.

French Patent No. 2 559 166 finally contains the description of a method of growing aluminium arsenate crystals ($AlAsO_4$), in which the crystals are grown from an aqueous solution of arsenic acid. Since, due to the retrograde solubility of $AlAs_O$ crystals, the crystalline phase in the growing solution is not stable at temperatures below saturation temperature and the $AlAsO_4$ crystals are dissolved before saturation temperature is reached, the use of berlinite seeds ($AlPO_4$) is proposed in the method according to the above description, which have the same crystal structure as $AlAsO_4$ and are largely resistant to dissolution by the growing solution. The disadvantage of the method described in the French Patent is that no homogeneous crystals can be obtained on account of stresses within the lattice in the vicinity of the seed due to differences in the lattice constants of $AlAsO_4$ and $AlPO_4$, which have negative effects on the properties of the crystal. Besides, use of the method is limited to $AlAsO_4$; $AlPO_4$ or $GaPO_4$ crystals cannot be obtained in this manner, for example.

SUMMARY OF THE INVENTION

It is the object of this invention to propose a method of growing crystals from hydrothermal growing solutions, which will avoid the above disadvantages and, above all, will largely prevent dissolution of the crystal seeds at the beginning of growing and of the grown crystals at the end of the growing process.

According to the invention this object is achieved by preparing, pre-saturating and pre-heating to a temperature close to saturation temperature the growing solution outside of the growing tank, and by adding the hot growing solution to the pre-heated growing tank provided with seed crystals for the growing process proper, where it is further heated to a temperature at which crystal growth will set in, and by quickly draining the hot growing solution from the growing tank as soon as the growing process has been completed. In this way the growing tank is charged with comparatively hot growing solution, which may quickly be removed from the autoclave upon completion of the growing process, thereby ensuring that the seed crystals or finished crystals in the autoclave are protected as well as possible while considerably reducing the time required until the growing equilibrium is reached in the growing tank.

The invention may provide that the growing solution be equilibrated in a tank similar to the growing tank before it is added to the growing tank containing the seed crystals, or that the growing solution be equilibrated in the growing tank itself before the growing process proper is initiated and the seed crystals are added to the growing tank.

Due to this equilibration in the growing tank itself prior to the growing process, or in a further growing tank connected thereto, the growing solution is allowed to reach a thermodynamic equilibrium with the inner walls of the growing tank and the elements built into it, before the beginning of the growing process.

In the invention the extent of equilibration is checked by means of probe seeds that are placed in the growing tank or a similar tank during this process.

In an enhanced version of the invention the growing solution is heated in the growing tank in a spatially homogeneous way, until a temperature is reached at which the crystals start growing, after which a temperature gradient over time is established and the heating process is continued slowly, and—once the growing solution is depleted of saturation material—the saturation region is cooled down and/or the growing region is further heated, thus giving a spatial, i.e., preferably vertical, temperature gradient. Tanks of a similar design or outfit can be used alternately for the growing of crystals and the preparation and/or equilibration of the growing solution.

In order to simplify procedure a further development of the invention may provide that the growing solution to be added to the growing tank be heated in a storage tank at standard pressure, and that it be further heated close to saturation temperature on its way into the growing tank, and that it be cooled off again upon completion of the growing process, when it is pumped back into the storage tank. In this way crystal deposits are largely prevented from forming on the walls of the storage tank or the tube between storage tank and growing tank. Since different tanks are used for preparation and growing, they may be furnished with the lining most appropriate for the specific purpose, and the growing tank is available for growing processes during the period in which the growing solution is being prepared or pre-saturated.

Many of the hydrothermal growing solutions required are very aggressive liquids, for example, the solutions of phosphoric acid used for crystal growing from metal orthophosphates in acid media, which will prohibit the use of conventional pumps for transferring them from one tank to the other, in addition to the risk that the vapor pressure of the hot solution is not reached in self-priming pumps. The invention therefore provides that the hot growing solution be added to the growing tank, or removed from it, with the use of a pressure medium—preferably compressed air—, an additional advantage being gained if the growing solution is fed into the growing tank at a pressure above the vapor pressure of the growing solution at saturation temperature, or if the growing solution is removed from the growing tank at a pressure above the vapor pressure of the growing solution at the temperature prevailing at the end of the growing process. The pumping process is performed at conditions of excess pressure, the pressure of the pressure medium being higher than the system pressure by 0.5 bar preferably. Because of the higher pressure in the storage tank higher temperatures may be achieved already there, which will permit the temperature required for crystal-growing in the growing tank to be obtained more quickly.

For growing monocrystals of metal orthophosphate, for instance, i.e., preferably $GaPO_4$ monocrystals, the invention provides that, in a storage tank with a glass lining preferably, a mixture of metal oxide, $H_3PO_4$ and $H_2O$ be processed into a growing solution of metal orthophosphate in $H_3PO_4$ and $H_2O$ at temperatures of 100° to 140° C., and that most of the temperature difference between the temperature in the storage tank and the initial temperature prevailing in the growing region of the growing tank of $<$ 200° C. be balanced by heating the growing solution during pumping. Typically, the growing solution, for instance during the growth of $GaPO_4$ crystals, is pre-heated in the storage tank to 120° to 140° C. approximately, and is pumped from the storage tank into the growing tank by means of compressed air; in this instance the temperature of the growing solution is raised by 25° to 30° C. before its entrance into the growing tank, which has been pre-heated to 160° C. It will also be possible, of course, to add at least parts of the respective metal orthophosphate to the growing solution to be prepared, in addition to the metal oxide.

According to the invention, a device as described above for implementing the method of the invention, comprising one or more growing tanks containing a hydrothermal growing solution, with fixtures for holding raw material for the crystals and crystal seeds, which tank(s) may be connected by a tube to at least one further tank, is characterized by the use of a siphoning device which is located in, or may be lowered into, the growing tank and/or the additional tank configured as a storage tank, and which is provided with a tube immersed into the growing solution and a connection for a pressure medium, preferably compressed air, permitting the growing solution to be transferred from one tank to the other by subjecting it to the pressure medium. In the device described by the invention it is possible to connect several storage tanks to several autoclaves, which will permit optimum use of the growing tank over time, depending on the time required for preparation and pre-saturation in the storage tanks and for the growing process in the growing tank itself. As the lower part of the growing tank, which contains the crystal seeds, is subject to temperature either the same as or higher than those in the upper part of the tank, which contains the raw material for the crystals, and as the growing tank is heated in this part, crystal material is deposited in the lower part of the growing tank as well. Since this would eventually stop up any drains located in this area, the use of a siphoning device operated with compressed air has proved of advantage for draining and charging of the tanks.

An essential aspect of the quality of crystals, e.g., of $GaPO_4$ crystals, is the chemical purity of the substance and, thus, that of the growing solution. The effects of impurity atoms, even in the ppm range, may already be noticed during crystallization, for instance, as retarded crystallization, domain-formation, influences on growth rates or growth kinetics.

If crystals are used as resonators or pressure transformers, impurity atoms may cause severe trouble, for instance, high power losses in resonators due to poor electrical insulation, or high lower limiting frequencies in measuring elements. Other drawbacks are a low quality factor, low sensitivity to temperature shocks and lower homogeneity.

It has turned out, for example, that the tantalum content of a solution is more or less linearly dependent on the process duration in the tantalum autoclave. As a consequence, it would be better to prepare the growing solution in a storage tank with walls of glass. If possible, pre-saturation should also take place in the storage tank, which would restrict use of the tantalum autoclave to the growing process proper. Since tantalum, like silicon and sodium, is incorporated to a certain extent into the crystal from the growing solution, the content of these elements in the growing solution must be kept as low as possible.

Unlike tantalum, the silicon content of growing solutions in glass tanks is mainly dependent on the maximum temperature reached, and to a lesser degree on the duration of the growing process; as temperatures in the storage tank are lower than in the growing tank, the silicon content of the growing solution may also be kept low. It is thus possible to reduce the content of impurity atoms in the crystals considerably by furnishing growing and storage tanks with different linings. The materials used for lining the tanks are selected in accordance with the respective growing solution and the specific parameters of growing and preparation, with a preference to corrosion-resistant, fluorine-containing plastics such as PTFE, acid-proof ceramics, glass and rare metals.

In the invention the elements built into the growing tank are designed such that the fixtures holding the raw material for the crystals, which are located in the upper part of the growing tank and which form a saturation rack, and the fixtures holding the seed crystals, which are located in the lower part of the growing tank, as well as a baffle placed between upper and lower parts of the growing tank, all are provided with central openings into which the immersion tube of the siphoning device is inserted. Both the fixtures for the raw material and those for the crystal seeds as well as the baffle placed between lower part and upper part have central openings through which the immersion tube may be lowered almost to the bottom of the growing tank when the autoclave is to be filled or emptied. During operation of the autoclave the central opening is occupied by temperature measuring elements. The baffle in the middle will maintain the vertical temperature gradient.

In order to adapt the device to various growing conditions it may be provided by the invention that the fixtures holding the raw material for the crystals and those for the crystal seeds be of a modular design and be mounted, together with the baffle, by common supporting elements shaped like rods in the assembled state, and that the built-in elements of the growing tank be made of PTFE or be coated with fluorinated plastic.

According to the invention the growing solution may be heated to the required temperature by providing a heat exchanger in the tube between the growing tank and the additional tank for preparation and/or pre-saturation of the growing solution, which is configured as a storage tank.

DESCRIPTION OF THE DRAWINGS

Following is a more detailed description of the invention as illustrated by the accompanying drawings, in which.

Figure 1:
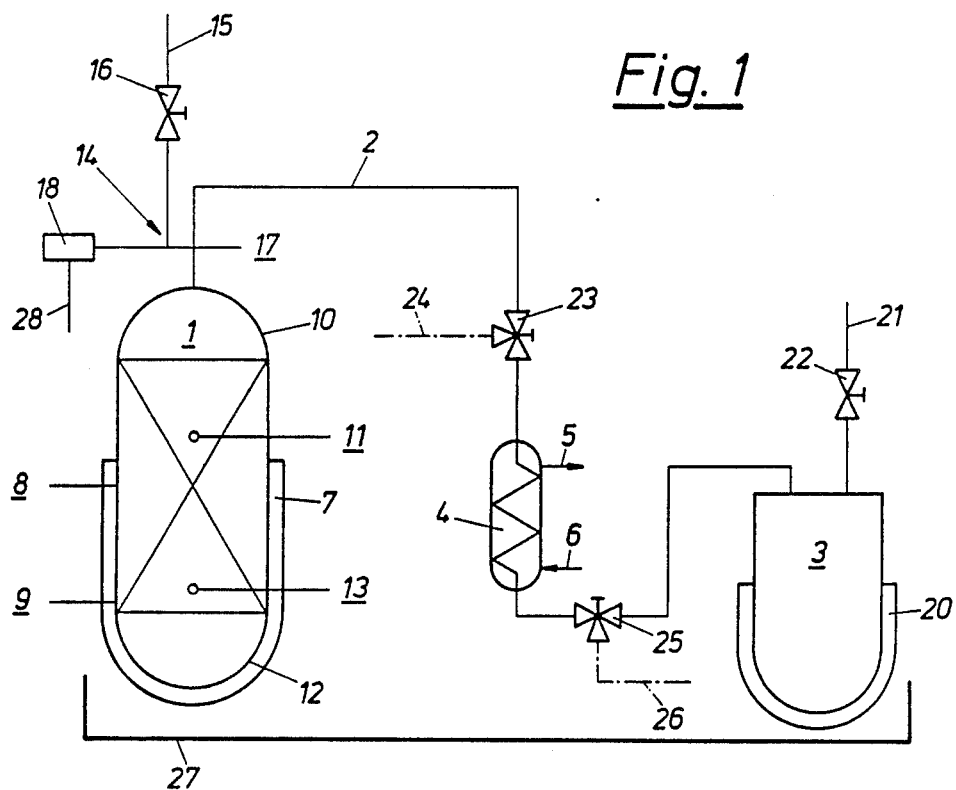
FIG. 1 is a schematic representation of a device according to the invention.
Figures 2, 3:
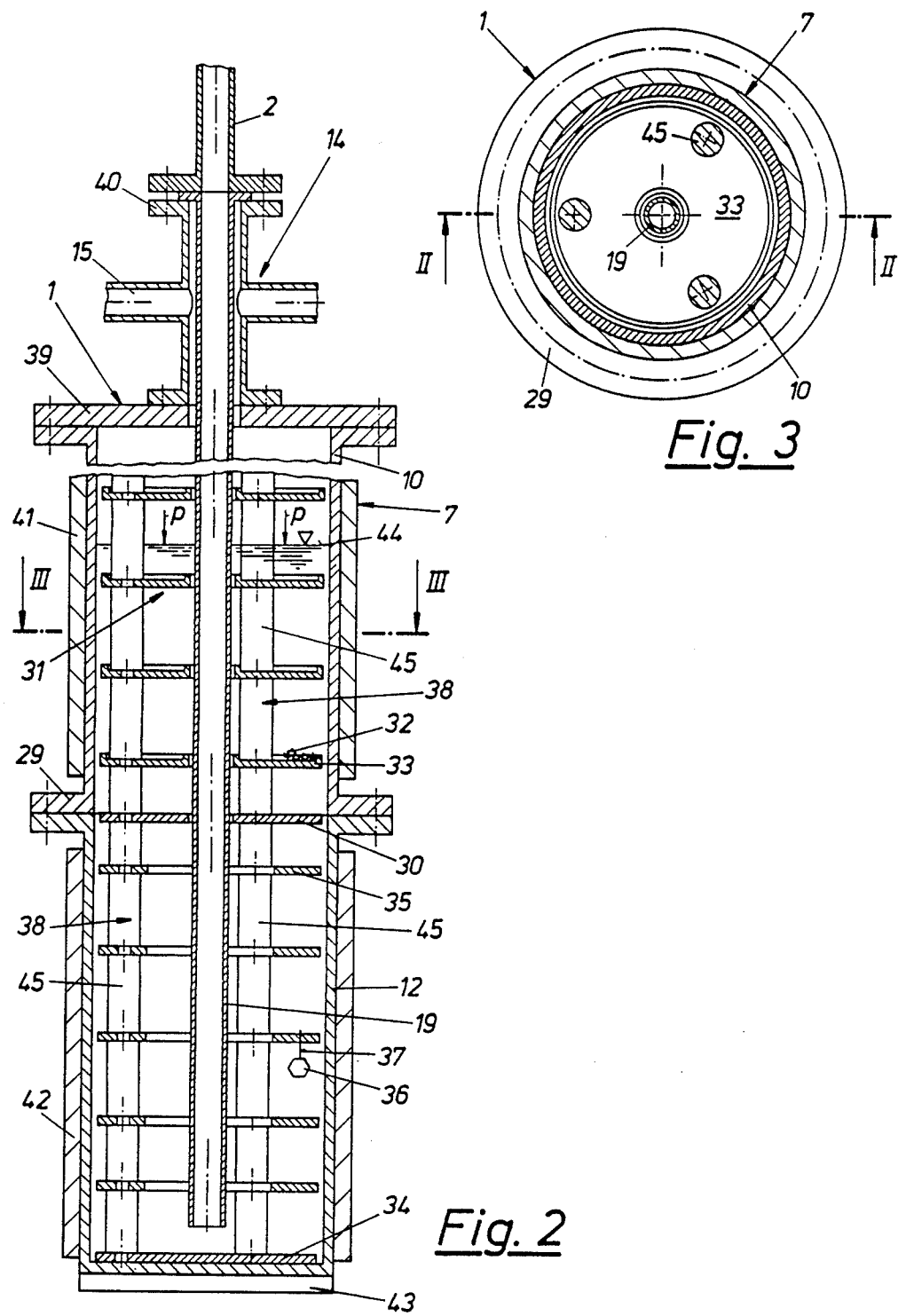
FIGS. 2 and 3 show a growing tank of the device according to the invention, cut along lines III—III and II—II in FIGS. 2 and 3, respectively.

The device shown in FIG. 1 comprises a growing tank 1 which can be connected to a storage tank 3 by means of a tube 2. In tube 2 is positioned a heat exchange unit, e.g., a heat exchanger 4 operated with silicone fluid, with fittings 5, 6 for the heat transfer medium. The temperature gradient required in the growing tank 1 is maintained by the heater unit 7, which may consist of several heating elements as shown in FIG. 2, which are controlled by two outside temperature measuring elements 8, 9 corresponding to the individual heating elements. The temperature inside the growing tank 1 is measured by the measuring element 11 in the upper part 10 and by the measuring element 13 in the lower part 12. The signals of the individual temperature measuring elements are processed by a process control unit not shown here.

For transferring the growing solution from the storage tank 3 to the growing tank 1 the removable tube 2 is connected to a siphoning device 14 on the growing tank 1. The siphoning device 14 has an inlet 15 for compressed air with a valve 16, and a pressure gauge 17 in a T-element as well as a bursting disk 18 as a safety element. The immersion tube 19 of the siphoning device 14 is shown in detail in FIGS. 2 and 3.

The storage tank 3 also is provided with a heater unit 20 and a compressed air inlet 21 with a valve 22. Further growing tanks may be connected, for instance via the three-way valve 23 and the tube 24, and further storage tanks via the three-way valve 25 and the tube 26, in order to fully utilize the growing tanks with regard to the respective duration of the growing process. For reasons of safety the whole system is placed in an overflow basin 27. The drain 28 following the bursting disk 18 opens into a condensation basin not shown here.

The growing tank 1 presented in detail in FIGS. 2 and 3 is used for crystal-growing from metal orthophosphates in acid media (e.g. $GaPO_4$ crystals from a $GaPO_4 - H_3PO_4H_2O$ solution), which should not be interpreted as a restriction of the use of the device to this group, however, since the device as described by the invention also is suitable for other processes of crystal-growing from hydrothermal solution, with retrograde solubility of the crystals.

The growing tank 1 essentially consists of two PTFE-lined tubes forming the upper part 10 and the lower part 12, which are joined by a flange 29. All other parts of the device that are in contact with the growing solution also have PTFE-linings.

In the plane of the flange 29 joining the two tubes is a baffle 30 controlling the hydrodynamic flow of the growing solution and maintaining the vertical temperature gradient. In addition to its central bore the baffle 30 may be provided with further bores influencing the flow conditions.

In the upper part 10 of the growing tank 1 is positioned the saturation rack 31 holding the respective amount of raw materials for the crystals 32 in individual fixtures 33 configured as circular trays.

The fixture for seed crystals built into the lower part 12 of the growing tank 1 comprises a base plate 34 and five ring-shaped holders 35, which are screwed together via rods 45 in three points. Prior to the growing process seed crystals 36 are attached to each of these ring-shaped holders 35, for instance with wires 37.

The areas in the centers of the fixtures 33 and 35 and of the baffle 30 are left open, which will permit the solution to be pumped off by means of the immersion tube 19, in addition to enabling the temperature of the growing solution to be measured during operation of the autoclave by means of the temperature measuring elements 11 and 13 mounted at different heights. The assembled rods 45 form three rod-shaped supports 38 carrying the saturation rack 31, the seed holders 35 and the baffle 30. A suitable material for the built-in elements in the growing tank is PTFE.

The upper part 10 of the growing tank 1 is covered by a reducing flange 39 bearing the siphoning device 14 with the immersion tube 19 and the compressed air inlet 15. When the growing solution is pumped off a pressure p will act on the surface 44 of the growing solution, permitting its quick removal from the growing tank. During operation the tube 2, for instance a hose lined with PTFE and reinforced with a steel coat, is removed from the flange 40, and the opening is covered with a blank flange.

The heater unit 7 comprises two ring-shaped heating elements 41, 42, each of which has a separate temperature control for maintaining the vertical temperature gradient. Another heating element 43 for heating the bottom of the device may be provided in addition.

For measuring temperatures in the interior of the device by means of measuring elements 11 and 13, two PTFE-sheated resistor thermometers are employed. Sealing of the temperature probes is effected by O-ring packing screws, the flange through which the probes pass being protected against corrosion by an E-CTFE coating. This sealing technique permits continuous height adjustment of the temperature probes used.

Following is a description of the start-up and shut-down of the autoclave by way of example.

The growing solution prepared and, possibly, presaturated in the storage tank 3 is heated in the storage tank to 120° C. approximately, and pumped into the growing tank 1, which has been pre-heated to 160° C. approximately, the temperature of the solution being raised by 25° to 30° C. by means of the heat exchanger 4. If the growing tank is to be equilibrated it should not contain any seed crystals apart from the probe seeds. Only after completion of the equilibration process—which may be determined by weighing the probe seeds—the growing solution is pumped back into the storage tank 3 by means of the siphoning device 14, and the seed crystals are added to the growing tank. After the growing solution has been pumped in, the crystal-growing process proper will set in, with a possible temperature difference of 5° to 30° C. in the growing tank between the growing region and the saturation region.

During operation a temperature/pressure diagram is used for checking the process.

When the autoclave is shut down the heating is switched off and the temperature of the growing tank is reduced to 140° C. approximately. After relieving the excess pressure, for example into a water bath, the siphoning device is introduced and the growing solution is pumped back into the storage tank via the heat exchanger 4, where it is cooled. After separation of the upper part 10 and the lower part 12 of the growing tank, the saturation rack 31 and the baffle 30 are dismounted and the holders 35 are removed together with the crystal yield.

We claim:

1. A method of growing homogeneous crystals in a growing tank from a hydrothermal growing solution, solubility of said crystals in said growing solution decreasing with an increase in temperature, consisting essentially of preheating an unsaturated growing solution which includes a dissolved salt corresponding to the crystals being grown to a temperature close to but less than saturation temperature, said preheating being carried out in an external tank separate from said growing tank, adding said preheated growing solution to said growing tank having seed crystals therein, and heating said growing solution in said growing tank to a temperature at which crystal growth is initiated.

2. A method according to claim 1, wherein said growing solution is equilibrated in said external tank before said growing solution is added to said growing tank containing said seed crystals.

3. A method according to claim 2, wherein said equilibration is checked by means of probe seeds.

4. A method according to claim 1, wherein said growing solution to be added to said growing tank is heated in said external storage tank at standard pressure, and is further heated closer to saturation temperature on its way into said growing tank.

5. A method according to claim 1, wherein said hot growing solution is added to said growing tank, and removed therefrom, with the use of a pressure medium.

6. A method according to claim 5, wherein said pressure medium is compressed air.

7. A method according to claim 5, wherein said growing solution is fed into said growing tank at a pressure above the vapor pressure of said growing solution at saturation temperature.

8. A method according to claim 5, wherein said growing solution is removed from said growing tank at a pressure above the vapor pressure of said growing solution at a temperature prevailing at the end of said growing process.

9. A method according to claim 1, wherein said hot growing solution is quickly drained from said growing tank as soon as said growing process has been completed.

10. A method according to claim 1, wherein said growing solution is equilibrated in said growing tank before said seed crystals are placed in said tank.

11. A method according to claim 10, wherein said equilibration is checked by means of probe seeds.

12. A method of growing $GaPO_4$ monocrystals according to claim 1, wherein said external tank is provided with a glass lining, a mixture of metal oxide, $H_3PO_4$ and $H_2O$ is processed into a growing solution of metal orthophosphate in $H_3PO_4$, and wherein said growing solution is further heated closer to saturation temperature on its way to said growing tank.

* * * * *